United States Patent [19]

Watanabe et al.

[11] Patent Number: 4,700,317
[45] Date of Patent: Oct. 13, 1987

[54] AUTOMATIC LAYOUT PLANNER AND A METHOD FOR AUTOMATICALLY CREATING A LAYOUT PLAN

[75] Inventors: Toshinori Watanabe, Sagamihara; Koji Sasaki, Tokyo; Chizuko Yasunobu, Yokohama; Yumiko Iizuka, Machida; Yoshiaki Nagai; Toshiro Yamanaka, both of Yokohama; Minoru Yamakoshi, Kamakura; Takashi Tanaka, Tokyo, all of Japan

[73] Assignee: Hitachi, Ltd., Tokyo, Japan

[21] Appl. No.: 675,861

[22] Filed: Nov. 28, 1984

[30] Foreign Application Priority Data

Nov. 28, 1983 [JP] Japan .................... 58-222044

[51] Int. Cl.⁴ ............ G06F 15/46; G06F 15/62
[52] U.S. Cl. .................... 364/488; 364/512; 364/521

[58] Field of Search .................. 364/488–491, 364/512, 518, 521, 475; 340/723, 724, 732, 734

[56] References Cited

U.S. PATENT DOCUMENTS

| | | | |
|---|---|---|---|
| 4,181,954 | 1/1980 | Rosenthal et al. | 364/512 X |
| 4,275,449 | 6/1981 | Aish | 364/512 |
| 4,549,275 | 10/1985 | Sukonick | 364/521 |
| 4,551,810 | 11/1985 | Levine | 364/512 X |

*Primary Examiner*—Felix D. Gruber
*Assistant Examiner*—H. R. Herndon
*Attorney, Agent, or Firm*—Antonelli, Terry & Wands

[57] ABSTRACT

Automatic layout planning without previously specifying place of each parts is made possible by utilizing groups of rules each comprising a condition section and a procedure section. An appropriate group of rules can be called from a knowledge base according to an intermediate layout plan generated in a data structure by a rule interpreter.

14 Claims, 2 Drawing Figures

AUTOMATIC LAYOUT PLANNER AND A METHOD FOR AUTOMATICALLY CREATING A LAYOUT PLAN

BACKGROUND OF THE INVENTION

The present invention relates to a system for laying out shaped objects such as geometrical objects and the like in a specific space, and in particular, to a system for automatically creating a layout plan under various restrictive conditions.

In an ordinary case, a layout design is generated through the man-machine conventional processing for laying out geometric objects. Such layout design forms a subject matter of the present invention.

For a conventional system applied to the above-stated purpose, the human designer for creating a layout plan is required to memorize various restriction about interrelationships between such objects in advance.

Recently, a system has been developed by an artificial intelligence study group in the United States of America in which computer parts are automatically arranged in the space inside a computer frame ($R_1$: the name of such a system developed by J. Mcdermott at C.M.U. see HAND-BOOK OF ARTIFICIAL INTELLIGENCE by E. Feigenbaum).

This system possesses a set of rules for determining the places at which computer parts are to be laid out and the layout system uses an appropriate rule depending on the progress of the designing work.

In this system, however, the candidate places of the parts to be laid out must be known in advance.

The best layout (place and direction) for placing an object in a specific space is determined depending on various information such as about objects already existing in the space and their locations and associated objects other than those placed in the space and their locations.

Consequently, a deterministic algorithm or procedure for placing such objects and the like in a space cannot be easily specified in advance.

For a placement problem for arranging objects in a space, the combinational optimization method has been adopted heretofore. When applying this method to a placement problem, the layout designer has usually approached the final solution by optimizing an objective function representing a parameter in this problem, for example, the layout area.

This method, however, is not preferably applied to a problem which handles information other than the element to be obtained through an object function, for example, information that reflects a layout of an object to be placed by conforming to a positional relationship to another object specified as the reference information such things as "the front line placed object should be in line". Consequently, it has been difficult to automatically generate a layout plan similar to one designed based on various information by the expert designer.

SUMMARY OF THE INVENTION

It is therefore an object of this invention to provide an automatic layout planner system for generating an appropriate layout design under a condition in which the placement of geometric objects cannot be specified in advance.

In order to achieve this object of the present invention, there is provided an automatic layout planner system composed of an inference engine and a knowledge base section which contains various knowledge to be utilized under various conditions encountered in the processing of an automatic layout for generating a layout design.

The objects and features of the present invention will become more apparent from the consideration of the following detailed description taken in conjunction with the accompanying drawings.

DESCRIPTION OF THE PREFERRED EMBODIMENTS

An embodiment of the present invention will be described in detail hereinbelow.

Figure 1:
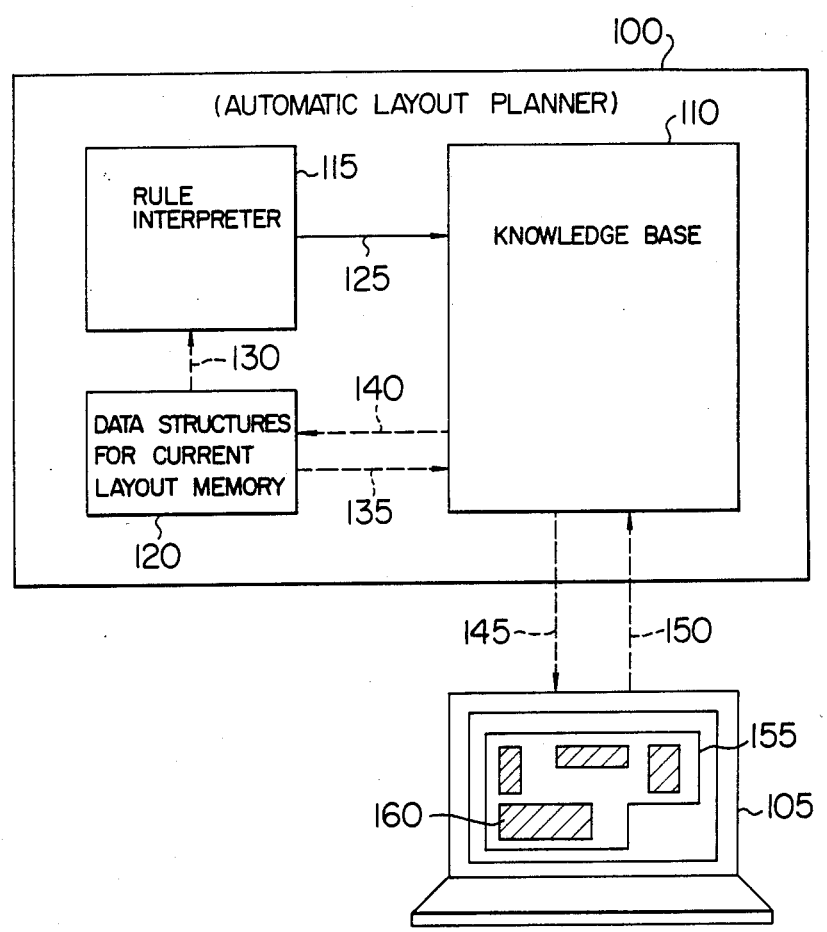
FIG. 1 is a schematic block diagram of an automatic layout planner system according to an embodiment of the present invention.

FIG. 1 illustrates the basic configuration of an automatic layout planner according to an embodiment of the present invention. A body 100 of the automatic layout planner comprises a knowledge base 110 containing various information items such as rules for specifying an appropriate area where devices may be placed, figures of a device, and functions for checking whether or not the restrictions imposed on the placement are satisfied. A rule interpreter 115 of FIG. 1 is utilized to select a proper rule from the knowledge base 110 (125) by referring to a data structure 120 representing the current layout state (130). The selected rule is used to collate the content of the data structure 120 (135) or to write an information item therein. When an information item in the data structure 120 is specified to be displayed (145) by use of a function stored in the knowledge base 110, the information item is displayed on a graphic display unit 105. In this example, display 105 shows a space 155 in which objects should be placed (the boundary of a computer room in this example) and shaped objects 160 such as a central processing unit and magnetic tape units in this example. The graphic display unit 105 is also used by a human designer to input information (150) to start the system, to revise the generated layout plan, and so on. In this embodiment, the system is implemented by use of the list processing (LISP) language.

Table 1 lists a part of the information stored in the data structure 120. A listing section 210 contains a data structure of the conditions to be satisfied when objects are placed. A system name, "Computer System for Design Automation Department, 211" has a generalized concept "SYSTEM" (212), and a plurality of objects (213) from L1 to L14 are assigned as units to be placed in a room having a name "computer machine room 1, 214" under eleven restrictive conditions (215) from C1 to C11 for the placement.

A listing section 220 of Table 1 defines the real shape of room 1 listed above. The room 1 has a generalized concept and has a shape specified by "RECT" for a rectangle whose longitudinal and transversal lengths are 11750 and 9500, respectively (222). Moreover, this listing section 220 contains the scale (223) for displaying the room on the graphic display unit 105 of FIG. 1. origin of the room (224), name of the door (225), name of the column in the room (226), origin of the free access area (227), and size of unit free access (228). A free access indicates a tile of the floor in the room and is ordinarily a square. When placing a machine, free accesses are removed before installing cables of the machine. The free access information is stored because the free access range and unit of the room must be checked for the placement.

A listing section 230 of Table 1 lists information about L1 specified in the layout unit group (213). The L1 has a generalized concept "object to be laid out, 231" and a machine name "H-8A60-01" (232). The pattern (plan view of the object L1) necessary for creating a layout plan is specified as "CPU6H30" (233), the L1 has a mnemonic name "CPU" (central processing unit, 234), and a "CPU" layout rule must be used to place the L1 (235).

A listing section 240 of Table 1 contains the data for the C10 listed in the restrictions (215). A description (241) indicates that the C10 has a generalized concept "far away, 241" and that machines such as "DISK", "CCP", "CPU", and "PDU" are to be placed far away from the door of the room (243), where the minimum distance from the door is three meters (244).

A listing section 250 of Table 1 indicates the current state of layout planning for placing an object OP4 in the room. Line 251 means that the data OP4 has a generalized concept "OP" (operation, 251) and "OP4" relates to the object "L1" (252). Furthermore, the position in the room is set by the user ("USER") from the graphic display unit 105 of FIG. 1 (253), the object is placed in room 1 (254), its shape is specified as "H-8A60-01" (255), and the maintenance area (required for the maintenance of this mahcine, for example, an area to be used to open a door) has its origin at a point ($-800, -800$) on the coordinate attached to the object to be arranged and is set with an angle of 0 degree on the coordinate attached to the room. The shape of the maintenance area is a rectangle ("RECT") whose size is indicated as $3860 \times 2300$ (256). This section 250 also contains information such as that the origin of OP4 is at a point (10102, 6417) on the coordinate attached to the room and the layout angle is $-90°$.

A listing section 260 of Table 1 specifies the current state of layout planning and causes the display of Computer System For Design Automation Department 211 (262) on the screen of the graphic display unit 105 of FIG. 1 in which the data (shape of the room and names of the objects to be placed) on the problem has been entered as the premise for generating the layout design (263).

Next, the contents of the knowledge base 110 shown in FIG. 1 will be described in conjunction with Table 2.

A listing section 300 contains a group of rules indicating the procedures for generating the layout design. A rule comprises a condition section and a procedure section. The condition section involves a condition of occurrence such as an "if" condition. The procedure section is the action to be taken such as the response to taken in satisfying an "if" condition. A rule in line 301, for example, specifies to stop generating the layout design if a data item, "problem already solved" is given as a data assigned with a reference number 260 in the data structure 120 of FIG. 1. A rule in line 302 means that the layout designing is to be initiated if "problem already entered" appears.

A rule in line 310 specifies to delete (DELETES) a data item, "problem being solved" from the data structure 260 listed in Table 1 and to execute some other processing if the state, "problem being solved" is changed to "end, 311".

A listing section 320 in Table 2 is an example of object layout rule and specifies to execute the layout planning by use of the using input (USER) if there does not exist a rule matching with the condition (the parameters ($>X>Y>Z$) contained in the IF clause in line 321 of Table 1 means that the rule invocation key X, Y, Z are variable which can match any three dimensional date so that the rule can be invoked whenever other rules cannot match current status of the data structure described by three dimensional data items and so the user input is preferred to continue problem solving.

A listing section 330 is a group of rules for specifying the locations of objects to be placed in which line 331 indicates to consider a plan to place a floppy disk (FD) unit in the range of space satisfying the condition "on the right-hand side of . M 2 M two meters far" with respect to a card reader if the card reader (CR) and a console display (CD) unit have been placed by satisfying the relationships specified by the parameters such as "to the right of . facing left".

Lines 340 to 370 of Table 2 are the functions contained in the rules described in conjunction with Table 2 (1). These lines 340–370 form a part of the knowledge base 110. Line 370, for example, is a function to be used to shift a position of an object layed out if the allocated area is insufficient for the object.

Table 3 is a part of the contents of the rule interpreter 115 shown in FIG. 1. Line 410 specifies a rule group control function for checking information stored in the data structure 120 of FIG. 1 to select a rule group stored in the knowledge base 110 of FIG. 1. (For example, the listing sections 300, 310, 320, and 330 of Table 2 each form a rule group consisting of a plurality of rules.) Line 420 is a function for calling a rule from the rule group specified above, while line 430 indicates a function which executes the right side of the invoked rule in order to generate a layout plan and associated data and to store them in the data structure 120 of FIG. 1.

Figure 2:
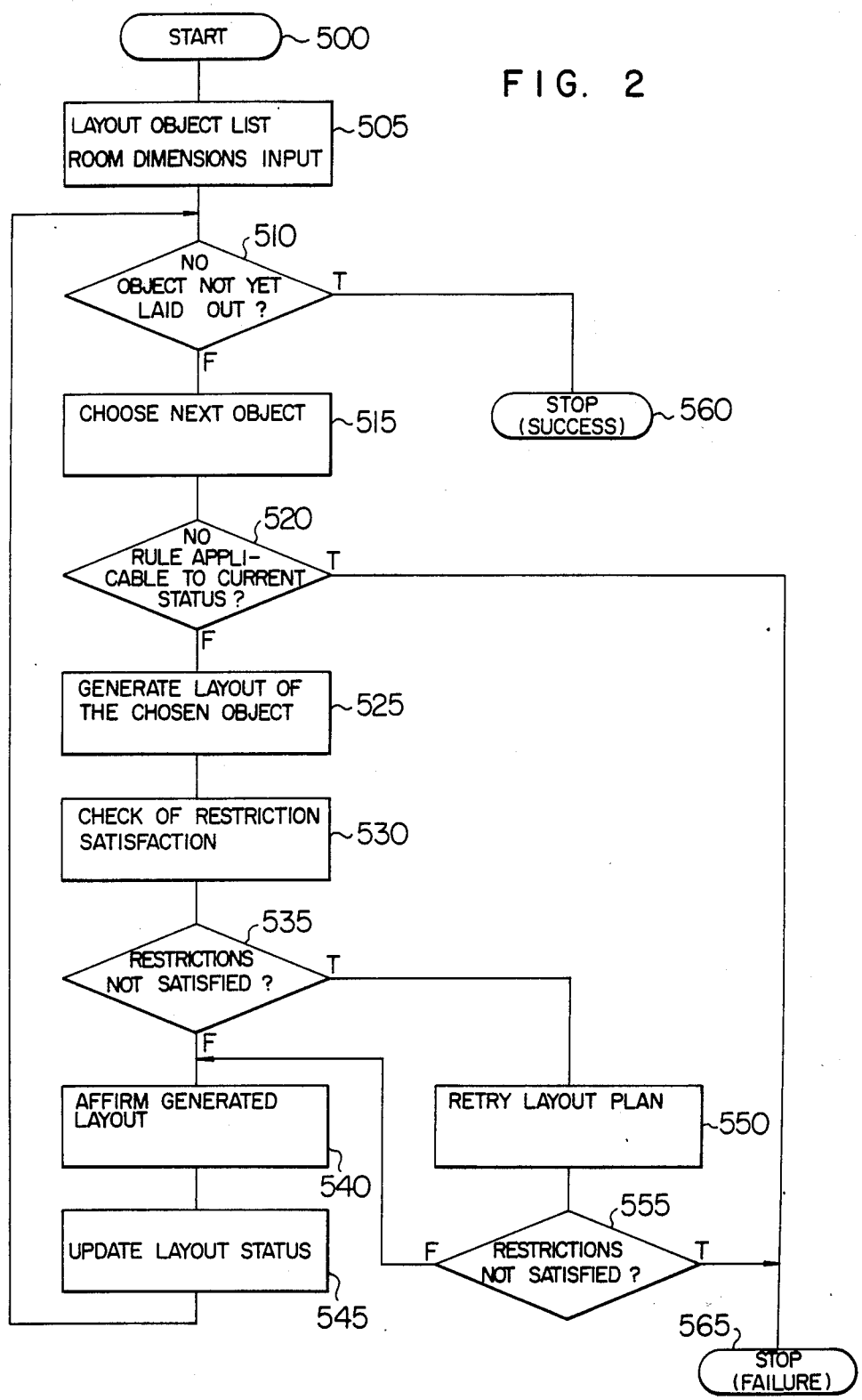
FIG. 2 is a processing flowchart for explaining the rule interpreter 115 of FIG. 1 in accordance with the embodiment of the present invention.

The operations of the embodiment will be described by referring to FIG. 2 in accordance with the present invention.

In step 505, the layout object, room information, and the like are entered to generate the data structures such as those specified by the listing sections 210, 220, 230, and 240. If it is found in step 510 that all devices have already been laid out, control is passed to step 560 in which the processing is terminated by regarding that all devices have been laid out; otherwise, the processing proceeds to step 515 is order to select a device to be laid out. In step 520, the system checks the layout rules such as those specified by the listing sections 320 and 330 to determine an applicable layout rule by using functions such as those listed in the lines 340, 345, and 350. If such an applicable item is missing, control is passed to step 565 in which the processing is terminated without determining the place for the device which could not be laid out; otherwise, steps 525 and 530 are sequentially processed to check each solution and to judge whether or not restrictions such as that defined by the listing section 240 are satisfied by using functions, for example, those listing in lines 370 and 380. If a solution satisfying the restrictions is found in step 535, the solution is selected in step 540 and the layout state is updated in step 545, then control is passed to step 510; otherwise, the processing proceeds to step 550 in which each solution is checked under conditions that the parallel displacement of the objects already laid out is allowed so as to satisfy the restrictive conditions. If a solution satisfying the restrictions is found in step 555, control is passed to step 540; otherwise, the processing proceeds to step 565 in which the processing is terminated.

As can be seen from the descriptions hereabove, the automatic layout planner system according to the present embodiment composed of a knowledge base comprising rules for processing various conditions which happens during the layout design process and the inference engine which calls an appropriate rule therefrom depending on a current condition; consequently, this system can be effectively applied to solve a problem, for example, a layout planning for which the processing procedures cannot be clearly defined in advance.

The capability for configuring a layout and for generating a layout plan can also be improved by employing additional rules.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

TABLE 1

| | | |
|---|---|---|
| | (computer system for design automation department) | 211 |
| | (AKO(VALUE(SYSTEM))) | 212 |
| | (layout unit)(VALUE(L1) | 213 |
| | (L2) | 213 |
| | (L3) | 213 |
| | (L4) | 213 |
| | (L5) | 213 |
| | (L6) | 213 |
| | (L7) | 213 |
| | (L8) | 213 |
| 210 | (L9) | 213 |
| | (L10) | 213 |
| | (L11) | 213 |
| | (L12) | 213 |
| | (L13) | 213 |
| | (L14))) | 213 |
| | (computer machine room)(VALUE 1(computer machine room )))) | 214 |
| | (restrictions)(VALUE(C1)(C2)(C3)(C4)(C5)(C6)(C7) (C8)(C9)(C10)(C11)))) | 215 |
| | 1(computer machine room 1)(AKO(VALUE(computer machine room)))) | 221 |
| | (shape)(VALUE((RECT 11750 9500)))) | 222 |
| | (room reduction scale)(VALUE((+0.2180000 +01+0.2180000 +01)))) | 223 |
| | (room origin)(VALUE((+0.1099750 +05 +0.5765000 +04)))) | 224 |
| 220 | (door)(VALUE(0001(door 0001)))) | 225 |
| | (column)(VALUE(0001(column 0001)(0002(column 0002) 0003(column 0003)))) | 226 |
| | (free access origin)(VALUE((−10 −13)))) | 227 |
| | (free access size)(VALUE(465)))) | 228 |
| | (L1(AKO(VALUE((layout)))) | 231 |
| | (machine)(VALUE(H-8A60-01))) | 232 |
| | (pattern)(VALUE(CPU6H30))) | 233 |
| | (ID(VALUE(CPU))) | 234 |
| | (rule)(VALUE(CPU))) | 235 |
| 230 | (OBJ(VALUE(H-8A60-01)(CPU)(CPU(CPU total))(machine) (object)))) | |
| | (LMT-ADDED(VALUE(C1)(C2)(C6)(C7)(C8)(C10)(C11))) | |
| | (LMT-ADDED-OTHERS (VALUE(C5)(C6))) | |
| | (LMT-CHANGED (VALUE(C1)(C2)(C6)(C7)(C8)(C10)(C11)))) | |
| | (C10(AKO(VALUE((far away)))) | 241 |
| | (subject)(VALUE(DISK)(CCP)(CPU)(CDU))) | 242 |
| 240 | (object)(VALUE(door))) | 243 |
| | (MIN(distance)(VALUE(3)))) | 244 |
| | (OP4(AKO(VALUE(OP))) | 251 |
| | (UNIT(VALUE(L1))) | 252 |
| | (relative position)(VALUE(USER))) | 253 |
| | (IN(VALUE(1(machine room 1)))) | 254 |
| | (shape)(VALUE(H-8A60-01))) | 255 |
| | (maintenance area)(VALUE((SHAPE(((−800 −800)0)(RECT 3860 2300)))))) | 256 |
| | (position)(VALUE(((10102 6417)−90)))) | 257 |
| 250 | (NODE(VALUE(OP3))) | |
| | (MAINTE-RANGE(VALUE(((9302 3357)(11602 7217))))) | |
| | (OBJ-RANGE(VALUE(((10102 3357)(10802 6417))))) | |
| | (ID(VALUE(CPU))) | |
| | (COUPLE(VALUE((OP26((−3815 −465)(−3270 465))(−3270 0)0)) ((OP27((2230 −465)(2785 465))(2230 0)0) ((OP28((−4415 −465)(−3060 465))(−3060 0)0)) ((OP29((−3815 −3700)(2185 −1500))(−815 −2700)0))))) | |
| | (machine room layout reproduction processing) | 261 |
| | (output)(VALUE((screen)))) | |
| 260 | (SYSTEM(VALUE((system DA center)))) | 262 |
| | (state)(VALUE((problem already | 263 |

TABLE 1-continued entered)))))

TABLE 2

```
       (INFERENCE-CON
        (HIT-STRATEGY(VALUE(SINGLE)))
        (RULES(VALUE(I1((IF(machine room                                          301
        layout being created)(problem already solved)))
        (THEN(SPOT)))))
        ((I2((IF(machine room
300     layout being created)(problem already solved)))                           302
        (THEN(PAGENDA YSOLVE)))))
        ((I3((IF(machine room
        layout being created)(screen already defined)))
        (THEN(PAGENDA IPROBLEM)))))
        ((I4((IF(>X >Y >Z)(THEN(PAGENDA ISCREEN))))))))
       (YSOLVE(HIT-STRATEGY(VALUE(SINGLE)))
        (RULES(VALUE((S1((IF(problem being solved)                                311
        (end)))
        (THEN(DELETES(problem
        being solved)))
        (DELETES(problem
        solving method))
310     (PAGENDA INFERENCE-CON)
        (CHANGEV
        (machine room layout being created)
        (problem already solved))))))
        (problem being
        solved check)
        (problem solving
        method automatic)))
       (YCD(HIT-STRATEGY(VALUE(SINGLE)))
        (RULES(VALUE((CD00((IF(>X >Y >X >Z))                                      321
        (THEN(ADDV USER (positioning
320     relative position USER))
        (PAGENDA YLOCATE)
        (CHANGEV(position-
        ing coordinate generation)))))))))
       YFD(HIT-STRATEGY(VALUE(MULTIPLE)(HIT-ONCEONLY)))
        (RULES(VALUE((FD00((IF(>X >Y >Z))
        (THEN(PAGENDA YLOCATE)
        (CHANGEV
        (positioning cordinate generation))))))
        ((FD01(IF PLAN >X(machine layout                                          331
        creation PLAN >X))
        (<X OP >CD)
        ( YIDENTIFY <CD 'CD)
        (<X OP >CR)
        ( YIDENTIFY <CR 'CR)
330     ( YLOOK <CR
        <CD
        (to the right of)
        (facing left)(M2)
        −0.2500000 +01 −0.5000000 +00))))
        (THEN(ADDV(positioning relative position)
        ( LIST
        (LIST<CR '(on the right-hand
        side of ' )(M 2 M))))
        (positioning)
        (on the left-hand
        side of ')(M 2 M))))
       (DEFUN YIDENTIFY(O AKO)                                                    340
       (COND((YAKOP O 'OP)(MEMBER AKO(YAKO-OP O)))
       (T(MEMBER AKO(FGETCLASSES O)))))
       (DEFUN YLOOK(OP1 OP2 REL PARMS)                                            345
       (FUNGALL(YIMPLODE "YLOOK-" (PNAME REL))OP1 OP2 PARMS))
       (DEFUN YRELATE(UNIT) PHR)                                                  350
       (LETS((OP(CAR PHR))(REL(CADR PHR))(PARMS(CDDR PHR)))
       (FUNCALL(YIMPLODE "YGEN-" (PNAME REL))UNIT OP PARMS)))
       (DEFUN YCENTER-OP(OP)                                                      355
       (LETS((TR(YFGET-V1 OP (' position))))
       (Y+VEC(CAR TR)(YPOLAR(YMID-FRONT(YPAER-OP OP))(CADR TR)))))
       (DEFUN YFRONT-OP(OP)                                                       360
       (LETS((TR(YFGET-V1 OP ('position)))(A(REMAINDER(ABS(CADR TR))180)))
       (COND((EQ 0 A)(CADAR TR))((EQ 90 A)(CAAR TR)))))
       (DEFUN YRANGE1-FRONT(OP)                                                   365
       (LETS((SH(YFGET-V1(YPAPER-OP OP) ('shape)))(F(YSIDE-90 SH 0))
       (B(YSIDE 90 SH 0))(V(YFRONT-OP OP))(A(CADR(YFGET-V1 OP
       ('position)))))
       (COND((OR(Y=ANGLE A 0)(Y=ANGLE A −90))(LIST(/−V F)(/+ V B)))
       ((OR(Y=ANGLE A 90)(Y=ANGLE A 180))(LIST(/−V B)(/+ V F))))))
```

TABLE 2-continued

```
        (DEFUN YUSER-COORDINATE(OP PLAN(NEWP T)(SLIDEP NIL))                370
        (PROG(A DEF ROOMTR VV L LMTS OBJS LMTOS OPS)
        (SETQ OBJS(YOBJLIST PLAN)OPS(YREMOVE OP(YFGET-V PLAN 'OP)))
        (COND(NEWP(SETQ LMTS(FGET-Z OP 'LMT-ADDED)
        LMTOS(FGET-Z OP 'LMT-ADDED-OTHERS)))
        (T(SETQ LMTS(FGET-Z OP 'LMT-CHANGED)
        LMTOS(FGET-Z OP 'LMT-CHANGED-OTHERS))))
        (COND(SLIDEP(SETQ A(CADR(YFGET-V1 OP ('position))))))
        LOOP(SETQ ROOMTR(I&ROOM(YFGET-V(YFGET-V1 PLAN 'SYSTEM) '
        ('computer machine room))))
        (COND(NOT SLIDEP)(SETQ A(Y&AG(CAR ROOMTR)(CADR ROOMTR)))))
        (SETQ L(YFGET-V1(CAR ROOMTR)('free access size)))
        (SETQ DEF(CADR ROOMTR))
        (YFPUT-V OP 'IN(CAR ROOMTR))
        (SETQ VV(YSELECT-SITES
        (LIST DEF)
        A
        (LIST(LIST(/-(CAR DEF)L)(/-(CADR DEF)L))
        (LIST(/+(CAR DEF)L)(/+(CADR DEF L)))
        NIL
        OP
        LMTS
        OBJS
        LMTOS
        OPS))
        (COND((NULL(CDDR VV))(YFCHANGE+--V OP ('position)(CAR VV))
        (YDISP-OP OP))
        (T(YFCHANGE+--V OP ('position)(LIST DEF A))
        (YDISP-OP OP))
        (YPRINT-VAL(CDR(YVALUE-OP OP LMTS OBJS LMTOS OPS NIL)))))
        (COND((YYESP(G-READ "OK(Y/N)?"))(RETURN(CAR VV)))(T(GO LOOP)))))
        (DEFUN YCOORDINATE(OP PLAN)                                        380
        (LETS((PHRS(YFGET-V1 OP('relative position)))(A(YGEN-
        ANGLE PHRS))
        (X(YGEN-RANGE PHRS(YFGET-V1 OP 'UNIT)))(RANGE(YCAR X))
        (DEFS(YCADR X))
        (V(YSELECT-SITES
        DEFS
        A
        RANGE
        PHRS
        OP
        (FGET-Z OP 'LMT-ADDED)
        (YOBJLIST PLAN)
        (FGET-Z OP 'LMT-ADDED-OTHERS)
        (YFGET-V PLAN 'OP))))
        (YCOUPLE-DEF OP)
        (COND((NULL(CDDR V))
        (YFCHANGE-V OP 'SCORE(CADR V))
        (YFCHANGE-V OP ('position)(CAR V)))
        (T(YFCHANGE-V OP NIL('position NIL))))))
```

TABLE 3

```
(DEFUN NINFCON ( )                                                         410
(PROG(INVRULEG OUTSTREAM INFENDFLG)
(SETQ PRINTLEVEL 0)
(COND((NULL *APRULESDEV*))
(T(SETQ OUTSTREAM
(OUTOPEN(STREAM(ALLOC *APRULESDEV*))))))
(SETQ INVRULEG' INFERENCE-CON)
(GO INF)
LOOP(COND((NULL *AGENDA*)
(SETQ INVRULEG 'INFERENCE-CON))
(T
(SETQ INVRULEG(NSETRULEG))))
INF(COND((NULL INFENDFLG)
(NRINTERPRT INVRULEG)
(GO LOOP))
(T
(COND((NULL *APRULESDEV*))
(T(CLOSE OUTSTREAM)
(CALL 'FREE
(STRING-APPEND "DS(" *APRULESDEV*")"))))
(RETURN)))))
(DEFUN NSETRULEG ( )                                                       420
(PROG(AM)
(COND((EQ *AGENDA-METHOD* 'FIFO)
(SETQ AM(CAR(REVERSE *AGENDA*))))
((EQ *AGENDA-METHOD* 'LIFO)
(SETQ AM(CAR *AGENDA*)))
```

TABLE 3-continued

```
(T
(SETQ AM(AMETHOD))))
(SETQ *AGENDA* (DELQ AM *AGENDA*))
(RETURN AM)))
(DEFUN NRINTERPRT (X)                                              430
(PROG(RGNAME HIT-STRATEGY RULELIST LEAVEFLG RULE RULE-NAME PATTERNS
RHS SHITFLG USEDRULES RULEALL)
(SETQ RGNAME(CAR(GET X 'FRAME)))
(SETQ HIT-STRATEGY(FGET X 'HIT-STRATEGY 'VALUE))
(SETQ RULELIST(FGET X 'RULES 'VALUE)
(COND((EQ(CAR HIT-STRATEGY) 'SINGLE)
(PROG ( )
LOOP1(COND((OR(NULL RULELIST)SHITFLG)(RETURN NIL)))
(SETQ RULE(CAR RULELIST))
(SETQ RULE-NAME(CAR RULE))
(SETQ PATTERNS(CDAADR RULE))
(PROG(FRAMESTACK SLOTSTACK VALSTACK)
(COND((NLHSCON PATTERNS)
(SETQ RHS(CDR(CADADR RULE)))
(NRHSCON RHS)
(NAPRULESCON RGNAME RULE)
(SETQ SHITFLG T))
(T
(SETQ RULELIST(CDR RULELIST))
(GO LOOP1))))))
((EQ(CAR HIT-STRATEGY) 'MULTIPLE)
(COND((NULL(CDR HIT-STRATEGY))
SLIST
```

What is claimed is:

1. An automatic layout planner for laying out an object in a layout space which has attributes which are a function of the layout space in which objects to be laid out in the layout space have a mutual relationship with each other comprising:
   a rule store means for storing a set of rules each of which has a condition section for applying the rule and a procedure section for determining a possible layout of an object in the layout space, different rules determining positions for laying out objects each having a shape;
   data structure generating means for generating data structures representing a current layout planning state to be used for determining layout positions of objects to be subsequently located in the layout space;
   rule calling and executing means for calling an appropriate rule from the rule store means and executing the rule depending upon an output from the data structure generating means with the result of execution of the rule being written in the data structure; and
   display means for displaying the data structure.

2. An automatic layout planner in accordance with claim 1 wherein the data structure generating means further comprises data structures representing the identity of the objects to be laid out in the layout space and the shape of the object.

3. An automatic layout planner in accordance with claim 1 wherein the data structure generating means further comprises restrictons on placement of an object within the layout space.

4. An automatic layout planner in accordance with claim 1 wherein the data structure generating means further comprises the current state of layout planning for placing an object within the layout space.

5. An automatic layout planner in accordance with claim 1 wherein the data structure generating means further comprises the current state of layout planning for causing display of the layout space on the display means.

6. An automatic layout planner in accordance with claim 1 wherein the set of rules stored within the rule store means comprises a group of rules for specifying the locations of objects to be placed in the layout space.

7. An automatic layout planner in accordance with claim 1 wherein the procedure section of a rule specifies a function to be performed by the rule in the laying out of an object in the layout space.

8. An automatic layout planner in accordance with claim 1 further comprising a rule interpreting means for selecting a rule from the rule store means by reference to a current layout state within the data structure generating means.

9. An automatic planner in accordance with claim 8 wherein the rule interpreting means comprises a rule group control function for checking information stored within the data structure generating means to select a rule group stored within the data structure generating means.

10. An automatic layout planner in accordance with claim 9 wherein the rule interpreting means further comprises a function for calling a rule from within the group of rules.

11. An automatic layout planner in accordance with claim 10 wherein the rule interpreting means further functions to generate a layout plan from a called rule to cause the layout plan to be stored in the data structure generating means.

12. A method for automatically generating a layout plan in a layout space having attributes which are a function of the layout space in which objects laid out in the layout space have a mutual relationship with each other in a planner having a rule store means for storing a set of rules each of which determines a possible layout of positions for laying out object in the layout space in which each object has a shape and display means for displaying a layout state in accordance with the shape of the objects comprising:
   generating a data structure representing a current layout state in the layout space of the objects; and
   calling, depending upon a latest state of the layout space, a layout rule having a condition section matched with the current layout state and executing a procedure section of the called layout rule.

13. A method of automatically generating a layout plan in accordance with claim 12 further comprising:

judging whether or not all of the objects have been laid out and terminating the layout plan when all objects have been laid out and calling a layout rule and executing the layout rule when all of the objects have not been laid out.

14. A method of automatically generating a layout plan according to claim 12 further comprising judging whether or not an applicable rule is found in the rule store means depending on the generated layout state and terminating the operation when an applicable rule is not found and calling a layout rule and executing the layout rule when an applicable rule is found.

* * * * *